(12) United States Patent
Kikuchi

(10) Patent No.: US 6,335,948 B1
(45) Date of Patent: Jan. 1, 2002

(54) AMPLITUDE DETECTOR AND EQUALIZER

(75) Inventor: Hidekazu Kikuchi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/182,518

(22) Filed: Oct. 30, 1998

(51) Int. Cl.[7] .......................... H03H 7/40; H03K 5/153
(52) U.S. Cl. ............................... 375/229; 327/60
(58) Field of Search .................. 375/229, 345, 375/349, 318, 230, 316, 317; 708/322, 323; 327/60, 50, 62, 69; 330/69, 279, 304; 348/514, 556, 618, 622, 725

(56) References Cited

U.S. PATENT DOCUMENTS 5,589,778 A * 12/1996 Ono et al. .................. 324/654
5,694,064 A * 12/1997 Watanabe et al. ............. 327/62
5,952,883 A *  9/1999 Masuta ....................... 330/279
5,955,918 A *  9/1999 Uno ............................. 330/9

* cited by examiner

Primary Examiner—Chi Pham
Assistant Examiner—Khai Tran
(74) Attorney, Agent, or Firm—Ronald P. Kananen; Rader, Fishman & Grauer PLLC

(57) ABSTRACT

The present invention provides an amplitude detector comprising: a first peak holding means for generating a first peak voltage signal for holding a peak voltage of a detected signal; a differential signal generating means for generating a differential signal between the first peak voltage signal and the detected signal; and a second peak holding means for generating an amplitude detect signal holding a peak voltage of the differential signal.

5 Claims, 6 Drawing Sheets

AMPLITUDE DETECTOR AND EQUALIZER

BACKGROUND OF THE INVENTION

The present invention generally relates to an amplitude detector and an equalizer.

When a video signal of R (Red), G (Green), and B (Blue) for example is transmitted through a copper monitor cable, the amplitude of the signal is detected by a destination receiver and, based on the detection result, the signal of which amplitude has been attenuated by transmission is amplified to restore the original signal.

FIG. 7 shows a constitution of a related-art amplitude detector 1 arranged in a receiver. As shown, the amplitude detector 1 has a capacitor 2, a full-wave rectifier 3, and a peak-hold circuit 4. In the amplitude detector 1, the DC component of a video signal S0 transmitted over a monitor cable is removed by the capacitor 2 and the AC component S2 of the video signal S0 shown in FIG. 8 is outputted to the full-wave rectifier 3. In the full-wave rectifier 3, the AC component S2 is full-wave rectified into a signal S3 shown in FIG. 8. In the peak-hold circuit 4, the peak voltage of the signal S3 is detected and an amplitude detect signal S1 for holding this peak voltage is outputted.

FIG. 9 shows a constitution of another related-art amplitude detector 11 arranged in a receiver.

As shown, the amplitude detector 11 has a capacitor 2, a positive peak-hold circuit 13, a negative peak-hold circuit 14, and an operational amplifier 15. In the amplitude detector 11, the DC component of a video signal S0 transmitted over a monitor cable is removed by the capacitor 2 and an AC component S2 of the video signal S0 shown in FIG. 10 is outputted to the positive peak-hold circuit 13 and the negative peak-hold circuit 14. In the positive peak-hold circuit 13, the positive peak voltage of the AC component S2 is detected and a signal S13 for holding the detected peak voltage is outputted. In the negative peak-hold circuit 14, the negative peak voltage of the AC component S2 is detected and a signal S14 for holding the detected peak voltage is outputted as shown in FIG. 10. In the operational amplifier 15, a differential voltage between the signal S14 and the signal S13 is detected and the detected differential voltage is outputted as an amplitude detect signal S11. According to the amplitude detector 11, the peak-to-peak amplitude of the AC component S2 of the video signal S0 can be correctly detected theoretically.

However, in the amplitude detector 1 shown in FIG. 7, if the duty ratio of the video signal S0 is deviated from 0.5, the amplitude detect signal S1 shown in FIG. 8 does not become a half of the peak-to-peak amplitude of the AC component 2, causing an error in a measured value. Consequently, the attenuated amplitude of the video signal S0 cannot be properly amplified for restoring the original signal.

Theoretically, the amplitude detector 11 shown in FIG. 9 can correctly detect the peak-to-peak amplitude of the AC component S2 of the video signal S0. Actually, however, the characteristic of the positive peak-hold circuit 13 and the characteristic of the negative peak-hold circuit 14 are not exactly in symmetry, so that an error occurs also in the amplitude detect signal S11.

SUMMARY OF THE INVENTION

It is therefore an object of the present invention to provide an amplitude detector capable of properly detecting an amplitude of a video signal for example.

In carrying out the invention and according to one aspect thereof, there is provided an amplitude detector comprising: a first peak holding means for generating a first peak voltage signal for holding a peak voltage of a detected signal; a differential signal generating means for generating a differential signal between the first peak voltage signal and the detected signal; and a second peak holding means for generating an amplitude detect signal holding a peak voltage of the differential signal.

In carrying out the invention and according to another aspect thereof, there is an amplitude detector comprising: a first peak holding means for generating a first peak voltage signal for holding a peak voltage of a detected signal; a first differential signal generating means for generating a first differential signal between the first peak voltage signal and the detected signal; a second peak holding means for generating a first amplitude detect signal holding a peak voltage of the first differential signal; a third peak holding means for generating a third peak voltage signal for holding a peak voltage of a reference signal; a second differential signal generating means for generating a second differential signal between the third peak voltage signal and the reference signal; a fourth peak holding means for generating a second amplitude detect signal holding a peak voltage of the second differential signal; and a third differential signal generating means for generating a third amplitude detect signal corresponding to a difference between the first amplitude detect signal and the second amplitude detect signal.

In the amplitude detector according to the invention, if the duty ratio of the input signal varies to vary an DC offset, the waveform of the first peak voltage signal follows the peak value of the input signal. Therefore, in the differential signal generating means, obtaining the difference between the first peak voltage signal and the input signal can obtain the differential signal indicative of the potential of the input signal relative to the first peak voltage signal. In the differential signal, the DC offset is canceled. Therefore, the amplitude detect signal having the peak-hold waveform of the differential signal correctly reflects the amplitude of the input signal relative to the output potential of the amplitude detect signal when the amplitude of the input signal is zero.

In carrying out the invention and according to still another aspect thereof, there is provided an equalizer comprising: a filter means for extracting a high-frequency component from an input signal to provide a first signal; a first amplifying means for amplifying, based on an amplification factor control signal, the first signal to generate a second signal; a second amplifying means for amplifying the input signal to generate a third signal; a superimposing means for superimposing the second signal and the third signal on each other to generate a fourth signal; and an amplitude detecting means for detecting an amplitude of the fourth signal to generate, based on the detected amplitude, the amplification factor control signal; the amplitude detecting means having a first peak holding means for generating a first peak voltage signal for holding a peak voltage of the fourth signal, a first differential signal generating means for generating a first differential signal between the first peak voltage signal and the fourth signal, a second peak holding means for generating a first amplitude detect signal holding a peak voltage of the first differential signal, a third peak holding means for generating a third peak voltage signal for holding a peak voltage of a reference signal, a second differential signal generating means for generating a second differential signal between the third peak voltage signal and the reference signal, a fourth peak holding means for generating a second amplitude detect signal holding a peak voltage of the second differential signal, and a third differential signal generating means for generating the amplification factor control signal corresponding to a difference between the first amplitude detect signal and the second amplitude detect signal.

BRIEF DESCRIPTION OF THE DRAWINGS

These and other objects of the invention will be seen by reference to the description, taken in connection with the accompanying drawing, in which.

DETAILED DESCRIPTION OF PREFERRED EMBODIMENTS

Figure 1:
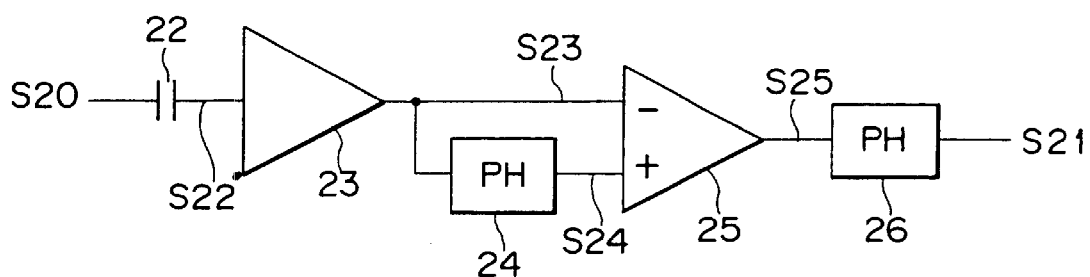
FIG. 1 is a diagram illustrating a constitution of an amplitude detector practiced as a first preferred embodiment of the invention.

This invention will be described in further detail by way of example with reference to the accompanying drawings.
First Preferred Embodiment:

FIG. 1 shows the constitution of an amplitude detector 21 practiced as a first preferred embodiment of the invention. As shown, the amplitude detector 21 comprises a capacitor 22, an amplifier 23, a peak-hold circuit 24 as a first peak-hold means, an operational amplifier 25 as a differential signal generator, and a peak-hold circuit 26 as a second peak-hold means.

In the amplitude detector 21, a detected signal S20 is inputted therein from one end of the capacitor 22, the other end thereof being connected to the input terminal of the amplifier 23. The output terminal of the amplifier 23 is connected to the "−" terminal of the operational amplifier 25 and the input terminal of the peak-hold circuit 24. The output terminal of peak-hold circuit 24 is connected to the "+" terminal of the operational amplifier 25. The output terminal of the operational amplifier 25 is connected to the input terminal of the peak-hold circuit 26. From the output terminal of the peak-hold circuit 26, an amplitude detect signal S21 is outputted.

Figure 2A:
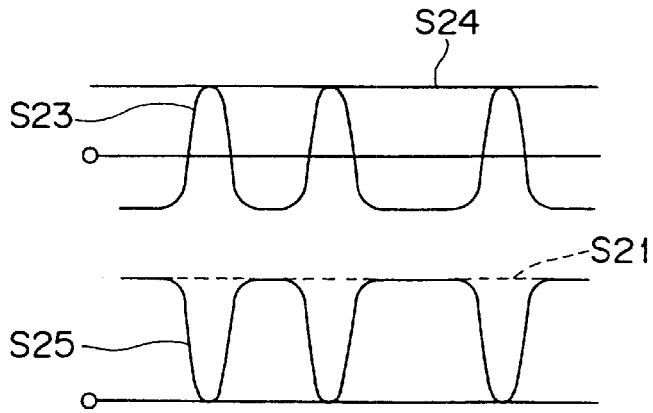
FIG. 2A and FIG. 2B are diagrams illustrating the waveforms of signals in the amplitude detector shown in FIG. 1.
Figure 2B:
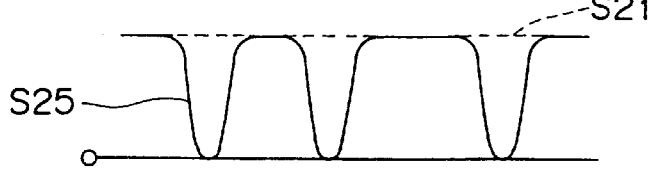

In the amplitude detector 21, an AC component S22 of the detected signal S20 is amplified by the amplifier 23. The amplified AC component S22 is inputted in the "−" terminal of the operational amplifier 25 and the input terminal of the peak-hold circuit 24 as a signal S23 having a waveform shown in FIG. 2A. Then, from the peak-hold circuit 24, a peak voltage signal S24 shown in FIG. 2A having the peak-hold waveform of the signal S23 is outputted to the "+" terminal of the operational amplifier 25. Next, from the output terminal of the operational amplifier 25, a differential signal S25 having a waveform shown in FIG. 2B corresponding to the differential voltage between the peak voltage signal S24 and the signal S23 is outputted to the input terminal of the peak-hold circuit 26. Then, from the peak-hold circuit 26, a peak-voltage signal S21 shown in FIG. 2B having the peak-hold waveform of the differential signal S25 is outputted.

In the amplitude detector 21, if the duty ratio of the signal S23 varies to vary an DC offset, the waveform of the peak voltage signal 524 follows the peak value of the signal S23. Therefore, in the operational amplifier 25, obtaining the difference between the peak voltage signal S24 and the signal S23 can obtain the differential signal S25 indicative of the potential of the signal S23 relative to the peak voltage signal S24. In the differential signal 525, the DC offset is canceled. Therefore, the amplitude detect signal S21 having the peak-hold waveform of the differential signal S25 correctly reflects the amplitude of the signal S23 relative to the output potential ("0" shown in FIGS. 2A and 29) of the amplitude detect signal S21 when the amplitude of the signal S23 is zero.

Second Preferred Embodiment:

In the amplitude detector 21 shown in FIG. 1, there occurs a slight deviations between the peak voltage of the signal S23 and the peak voltage signal S24, and between the peak voltage of the signal S25 and the amplitude detect signal S21 because of the asymmetry between the outputs of the amplifier and peak-hold circuit 24 or the response frequency limit of peak-hold circuit 26 for example. These deviations are made obvious when the period of the detected signal S20 is relatively short, thereby lowering amplitude measuring accuracy. An amplitude detector practiced as the second preferred embodiment of the invention is intended to reduce the effect of the deviation in peak between the signals.

Figure 3:
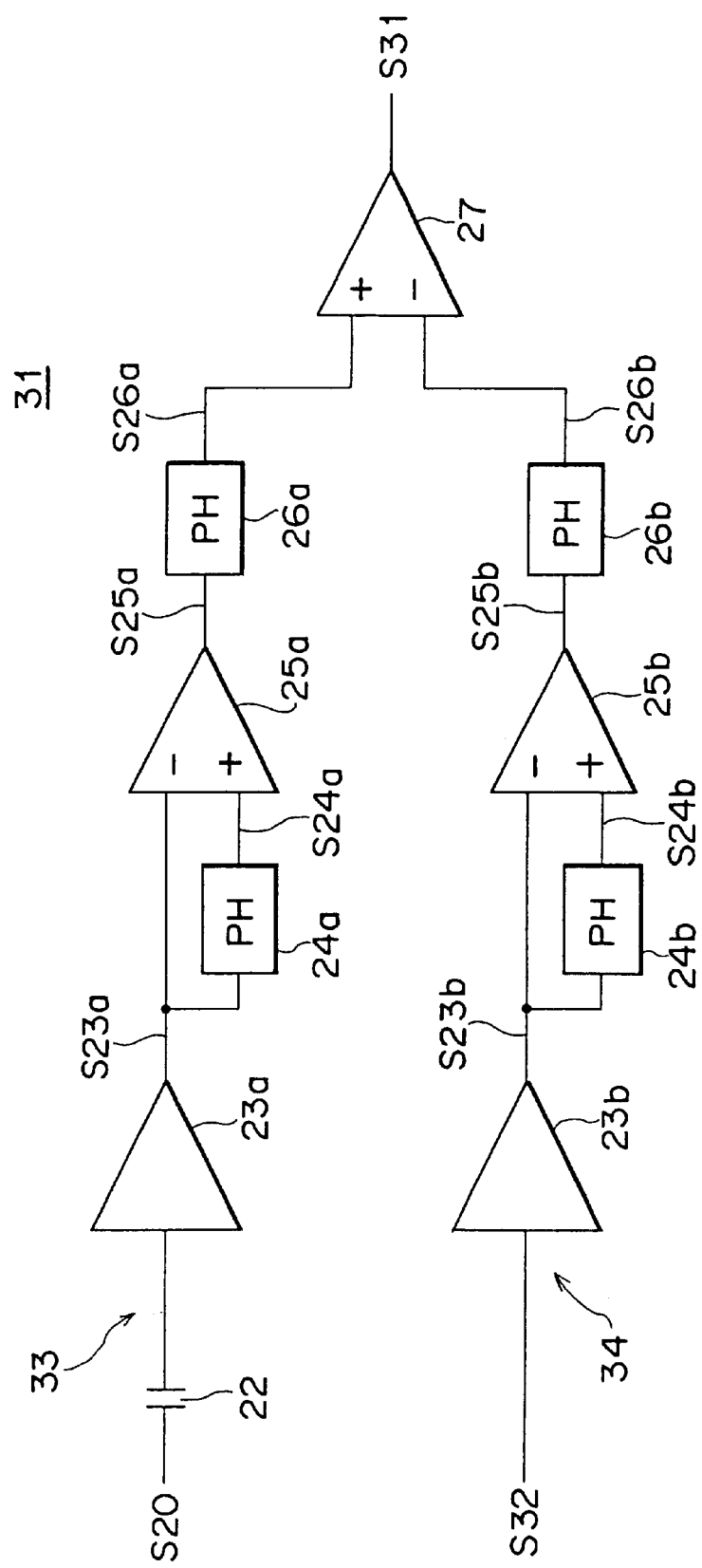
FIG. 3 is a diagram illustrating a constitution of an amplitude detector practiced as a second preferred embodiment of the invention.

FIG. 3 shows a constitution of the amplitude detector 31 practiced as the third preferred embodiment. As shown, the amplitude detector 31 comprises amplitude detecting circuits 33 and 34 and an operational amplifier 27. In the amplitude detector 31, a detected signal S20 is inputted in the amplitude detecting circuit 33. From the amplitude detecting circuit 33, an amplitude detect signal S26a is inputted in the "+" terminal of the operational amplifier 27 At the same time, a reference signal S32 is inputted in the amplitude detecting circuit 34. From the amplitude detecting circuit 34, an amplitude detect signal S26b is inputted in the "−" terminal of the operational amplifier 27. The reference signal S32 has a frequency approximately the same as the frequency of the detected signal S20 and an amplitude approximately the same as an amplitude expected of the detected signal S20. From the operational amplifier 27, an amplitude detect signal S31 equivalent to the differential voltage between the amplitude detect signals S26a and S26b is outputted.

The amplitude detecting circuit 33 has generally the same constitution as that of the amplitude detector 21 shown in FIG. 1. The amplitude detecting circuit 34 has generally the same constitution as that of the amplitude detector 21 shown in FIG. 1 except that the capacitor 22 is not provided.

To be more specific, the amplifiers 23a and 23b shown in FIG. 3 are the same the amplifier 23 shown in FIG. 1. The peak-hold circuits 24a and 24b are the same as the peak-hold circuit 24 shown in FIG. 1. The operational amplifiers 25a and 25b are the same as the operational amplifier 25 shown in FIG. 1. The peak-hold circuits 26a and 26b are the same as the peak-hold circuit 26 shown in FIG. 1.

In the amplitude detector 31, if the detected signal S20 is a high-frequency signal, the effect of the deviation in peak between the input and output signals of the peak-hold circuit as described above appears on both the amplitude detect signals S26a and S26b equally.

Therefore, differentially amplifying the amplitude detect signals S26a and S26b through the operational amplifier 27 can detect with a high precision the amplitude of the detected signal S20 with reference to the amplitude of the reference signal S32.

Figure 4:
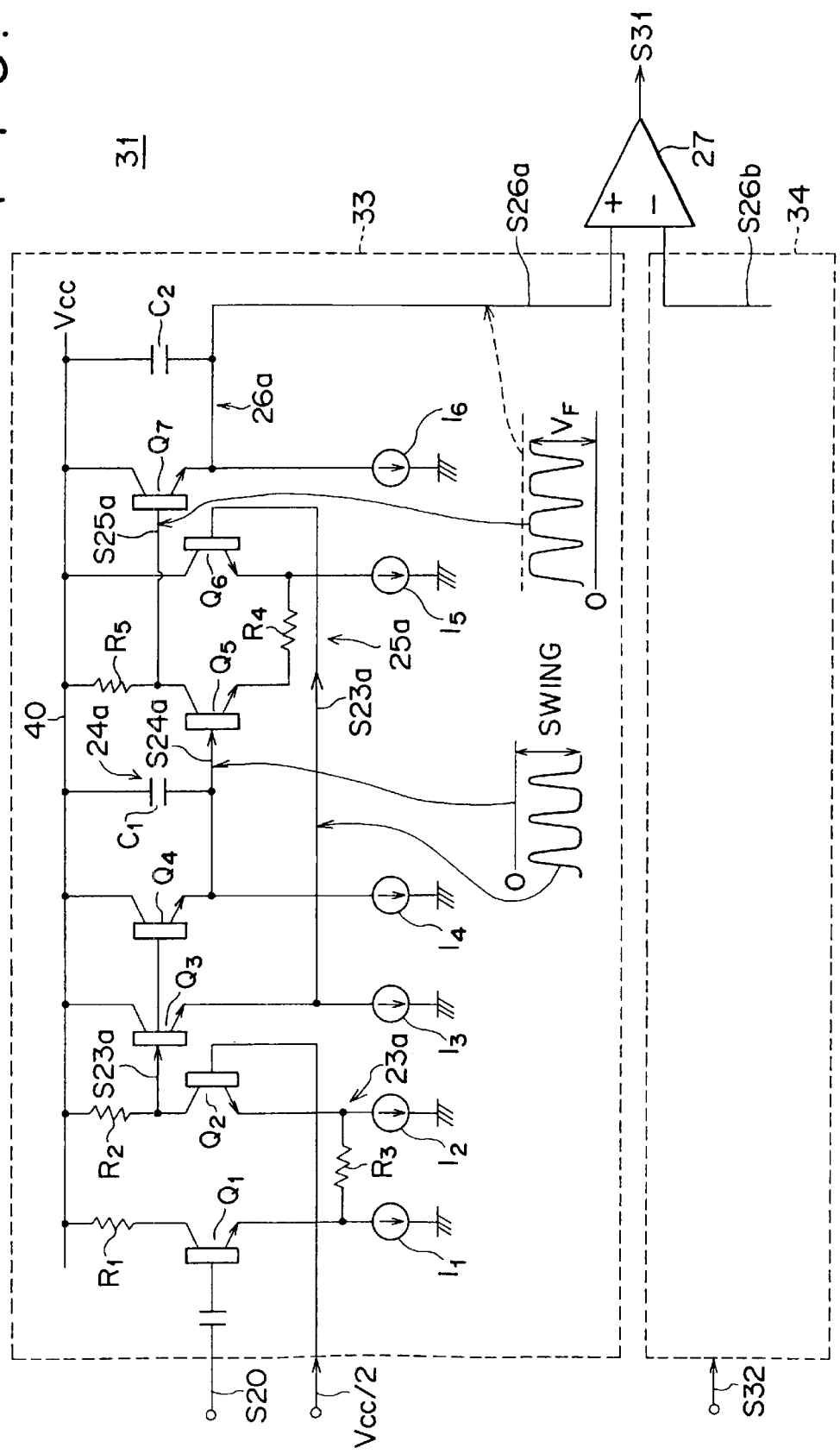
FIG. 4 is a circuit diagram illustrating a particular constitution of the amplitude detector shown in FIG. 3 practiced as a third preferred embodiment of the invention.

Third Preferred Embodiment:

FIG. 4 shows a specific circuit of the amplitude detector 31 shown in FIG. 3. As shown, an amplifier 23a of the amplitude detector 31 is composed of a npn-channel transistors $Q_1$ and $Q_2$, resistors $R_1$, $R_2$, and $R_3$, and constant current sources $I_1$ and $I_2$. The base of the transistor $Q_2$ is applied with a constant potential equal to the bias of the transistor $Q_1$, for example, Vcc/2, and a differential signal having the same bias as that of the signal of the transistor $Q_1$ but having the reverse signal polarity. The collectors of the transistors $Q_1$ and $Q_2$ are connected to a power supply line 40 through the resistors $R_1$ and $R_2$ respectively. The power supply line 40 is held a supply voltage Vcc. The base of the transistor $Q_1$ is applied with a detected signal S20 through a capacitor 22. The collector of the transistor $Q_2$ is connected to the base of the transistor $Q_3$. The emitters of $Q_1$ and $Q_2$ are connected across $R_3$. The collector of the transistor $Q_3$ is connected to the power supply line 40 and the emitter of this transistor is connected to ground through a constant current source $I_3$. The emitter of the transistor $Q_3$ is connected to the base of a transistor $Q_6$.

The peak-hold circuit 24a is composed of a transistor $Q_4$, a capacitor $C_1$, and a constant current source $I_4$. The collector of the transistor $Q_4$ is connected to the power supply line 40. The base of this transistor is connected to the collector of the transistor $Q_3$. The emitter of this transistor is connected to ground through the constant current source $I_4$. One end of the capacitor $C_1$ is connected to the power supply line 40 and the other end to the emitter of the transistor $Q_4$ and the base of a transistor $Q_5$.

The operational amplifier 25a is composed of transistors $Q_5$ and $Q_6$, resistors $R_4$ and $R_5$, and a constant current source $I_5$. The collector of the transistor $Q_6$ is connected to the power supply line 40. The emitter of this transistor is connected to the emitter of the transistor $Q_5$ through the resistor $R_4$. The emitter of the transistor $Q_6$ is connected to ground through the constant current source $I_5$. The base of the transistor $Q_6$ is applied with a signal S23a through the transistor $Q_3$31. The collector of the transistor $Q_5$ is connected to the power supply line 40 through the resistor $R_5$.

The peak-hold circuit 26a is composed of a transistor $Q_7$, a capacitor C2, and a constant current source $I_6$. The base of the transistor $Q_7$ is connected to the collector of the transistor $Q_5$. The collector of the transistor $Q_7$ is connected to the power supply line 40. The base of this transistor is connected to ground through the constant current source $I_6$. One end of the capacitor C2 is connected to the power supply line 40 and the other end to the emitter of the transistor $Q_7$ and the "+" terminal of the operational amplifier 27.

Referring to FIG. 4, the resistance value of each of the resistors $R_1$, $R_2$, and $R_3$ is 1 kΩ. The resistance value of each of the resistors $R_4$ and $R_5$ is 2 kΩ. Each of the constant current sources $I_1$, $I_2$, and $I_3$ outputs a constant current of 250 μA. Each of the constant current sources $I_4$ and $I_6$ outputs a constant current of 4 μA. The constant current source $I_5$ outputs a constant current of 500 μA. The amplitude detecting circuit 34 has generally the same constitution as that of the amplitude detecting circuit 33 shown in FIG. 3 except that the capacitor 22 is not provided.

In the amplitude detecting circuit 33 of the amplitude detector 31 shown in FIG. 4, the DC component of the detected signal S20 is removed by the capacitor 22 and the AC component S22 of this signal is applied to the base of the transistor $Q_1$ to be amplified. The amplified AC component S22 is then applied to the bases of the transistors $Q_3$ and $Q_4$ as a signal S23a. The peak potential of the signal S23a is applied to the base of the transistor $Q_5$ as a peak voltage signal S24a corresponding to the stored charge of the capacitor $C_1$ of the peak-hold circuit 24a. The signal S23a is then applied from the emitter of the transistor $Q_3$ to the base of the transistor $Q_6$.

Next, the peak voltage signal S24a indicative of the peak potential of the signal S23a and the signal S23a are differentially amplified by the operational amplifier 25a. A resultant differential signal S25a is applied to the base of the transistor $Q_7$. The peak potential of the differential signal S25a is inputted to the "+" terminal of the operational amplifier 27 as an amplitude detect signal S26a corresponding to the stored charge of the capacitor C2 of the peak-hold circuit 26a. Namely, if the DC balance of the signal S23a is not kept, the base line fluctuates. Therefore, the absolute value of the peak voltage signal S24a indicative of the peak of the signal S23a does not represent the amplitude of the signal S23a. At this moment, the interval between the potential at the bottom of the waveform of the signal S23a and the potential of the peak voltage signal S24a represents the amplitude. Consequently, the peak potential of the differential signal S25a obtained by rolling back the signal S23a relative to the peak voltage signal S24a that represents the amplitude.

On the other hand, in the amplitude detecting circuit 34, the same processing as that executed on the detected signal S20 in the amplitude detecting circuit 33 is executed on the reference signal S32. A resultant amplitude detect signal S26b is outputted to the "−" terminal of the operational amplifier 27. Then, an amplitude detect signal S31 equivalent to the differential voltage between the amplitude detect signal 26a and the amplitude detect signal S26b is outputted from the operational amplifier 27.

Fourth Preferred Embodiment

Figure 5:
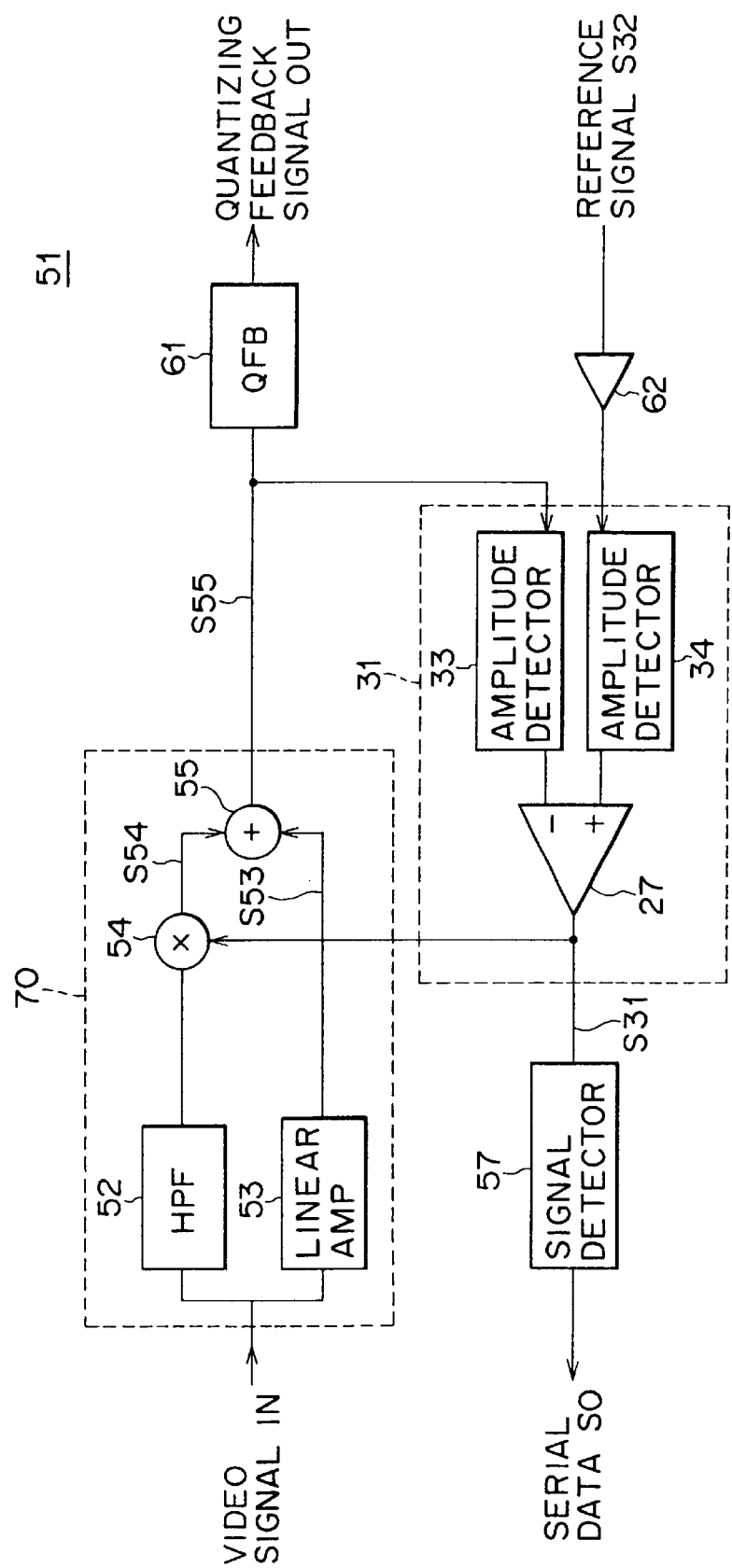
FIG. 5 is a diagram illustrating a constitution of an equalizer practiced as a fourth preferred embodiment of the invention.

The following describes an equalizer that incorporates the above-mentioned amplitude detector. FIG. 5 shows a constitution of an equalizer 51 practiced as a fourth preferred embodiment of the invention. As shown, the equalizer 51 comprises an BEA (High Emphasis Amplifier) 70, a signal detector 57, the amplitude detector 31 functioning as an AGC (Automatic Gain Control), a QFB (Quantization Feedback Comparator), and an amplifier 62. The equalizer 51 is installed in a receiver for example. A video signal IN representing R, G, B is inputted in the equalizer 51 through a copper monitor cable. A quantizing feedback signal OUT and a serial data SD are outputted from the equalizer 51 accordingly.

The HEA 70 has a three-pole HPF (High Pass Filter) 52, a linear amplifier 53, an amplifier 54, and a superimposing circuit 55. In the HEA 70, the high-frequency component of the inputted video signal IN is extracted by the HPF 52. The extracted high-frequency component is amplified by the amplifier 54 to be inputted in the superimposing circuit 55 as a signal S54. At this moment, the amplification factor of the amplifier 54 is determined by the amplitude detect signal S31 functioning as a amplification factor control signal from the amplitude detector 31. This automatically controls the gain of the signal S54. At the same time, the video signal IN is linear-amplified by the linear amplifier 53 into a signal S53, which is inputted to the superimposing circuit 55. In the superimposing circuit 55, the signal S54 and the signal S53 are superimposed on each other. A resultant superimposed signal S55 is inputted in the amplitude detecting circuit 33 of the amplitude detector 31 and the QFB 61. This compensates the high-frequency component lost in cable attenuation.

Figure 6:
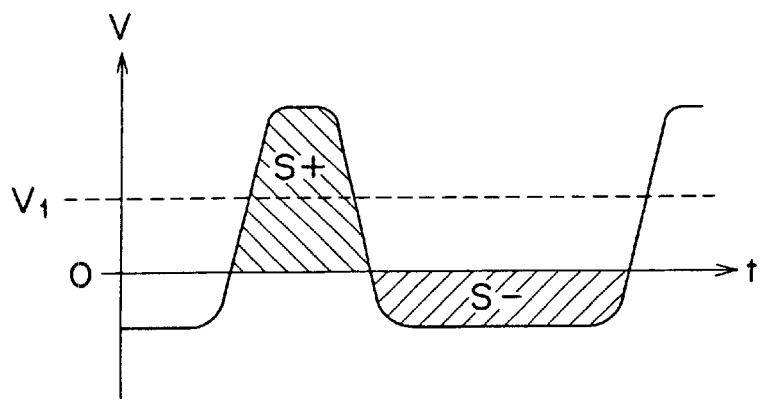
FIG. 6 is a diagram for describing a comparator that performs comparison with reference to DC center and amplitude center.
Figure 7:
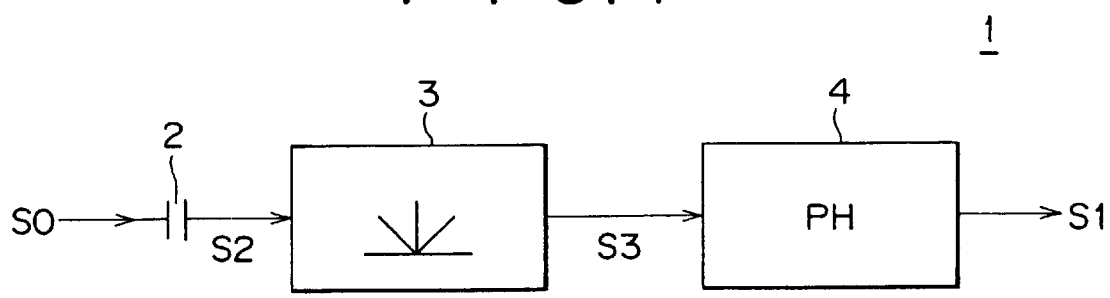
FIG. 7 is a diagram illustrating a constitution of a related-art amplitude detector arranged in a receiver.
Figure 8:
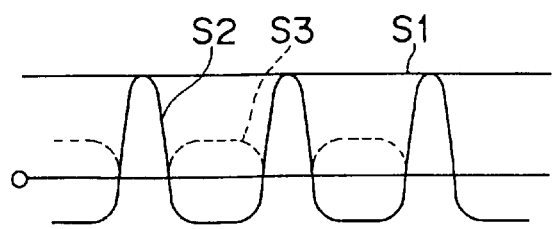
FIG. 8 is a diagram illustrating the waveforms of signals in the amplitude detector shown in FIG. 7.
Figure 9:
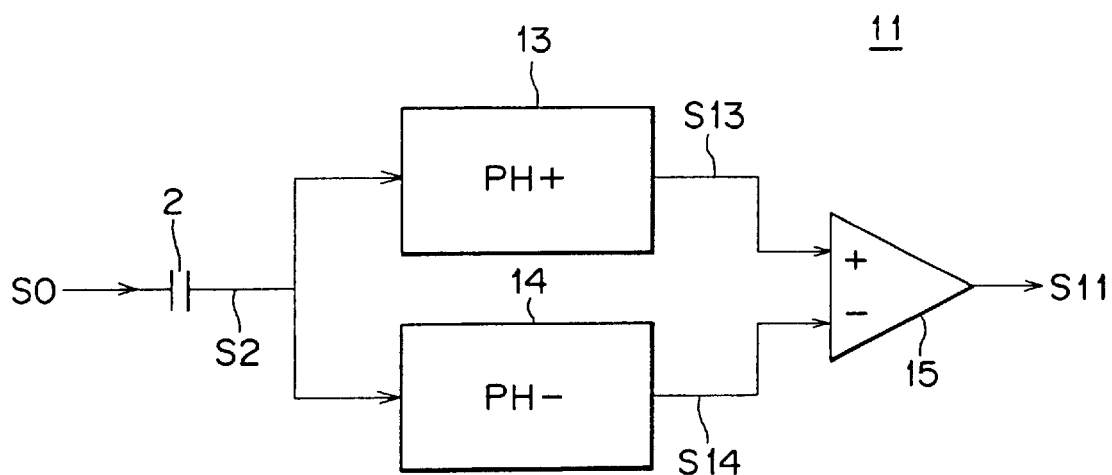
FIG. 9 is a diagram illustrating a constitution of another related-art amplitude detector arranged in a receiver.
Figure 10:
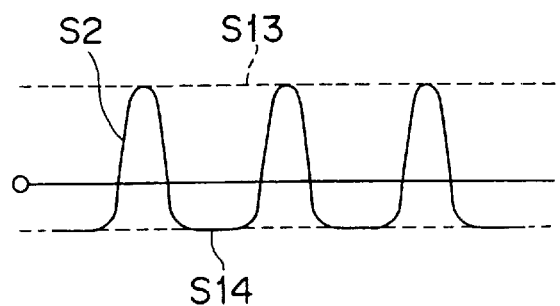
FIG. 10 is a diagram illustrating the waveforms of signals in the amplitude detector shown in FIG. 9.

The QFB 61 is a comparator that operates with reference to not DC center but amplitude center. Therefore, the QFB 61 compares the superimposed signal S55 with a predetermined reference value to generate the quantization feedback signal OUT. The quantization feedback signal OUT is used as a digital signal identified by compensating the signal distorted by copper wire transmission. Namely, if the duty ratio of the superimposed signal S55 is small, a location at which area S+ of "+" region matches area S− of "−" region in a waveform shown in FIG. 6 becomes the DC center (V=0). In the QFB 61, amplitude center $-V_1$, which is the center potential of waveform amplitude provides a threshold.

The amplitude detector 31 is the circuit shown in FIGS. 3 and 4. The superimposed circuit signal S55 and, through the amplifier 62, the reference signal S32 are inputted in the amplitude detector 31 to generate the amplitude detect signal S31. This amplitude detect signal S31 is inputted in the amplifier 54 and the signal detector 57.

The signal detector 57 detects that the output of the amplitude detector 31 is a desired value or higher and generates the signal detect output SD.

According to the equalizer 51, precision amplitude detection is performed in the amplitude detector 31, so that the quantization feedback signal OUT and the signal detect output SD can be generated with great precision.

The present invention is not limited to the above-mentioned embodiments. For example, the amplitude detector 21 shown in FIG. 1 can be implemented by not only the circuit constitution shown in FIG. 3 but also any other circuit constitution having the equivalent capabilities. In addition, the amplitude detector 21 may be incorporated in not only the equalizer 51 shown in FIG. 3 but also an AGC for example.

As described, the amplitude detector according to the invention can properly detect the amplitude of a detected signal. According to the equalizer according to the invention, an attenuated input signal can be compensated with great precision.

While the preferred embodiments of the present invention have been described using specific terms, such description is for illustrative purposes only, and it is to be understood that changes and variations may be made without departing from the spirit or scope of the appended claims.

What is claimed is:

1. An amplitude detector comprising:
   a first peak holding means for generating a first peak voltage signal for holding a peak voltage of a detected signal;
   a first differential signal generating means for generating a first differential signal between said first peak voltage signal and said detected signal;
   a second peak holding means for generating a first amplitude detect signal holding a peak voltage of said first differential signal;
   a third peak holding means for generating a third peak voltage signal for holding a peak voltage of a reference signal;
   a second differential signal generating means for generating a second differential signal between said third peak voltage signal and said reference signal;
   a fourth peak holding means for generating a second amplitude detect signal holding a peak voltage of said second differential signal; and
   a third differential signal generating means for generating a third amplitude detect signal corresponding to a difference between said first amplitude detect signal and said second amplitude detect signal.

2. The amplitude detector as set forth in claim 1, further comprising a capacitor that is arranged in a preceding stage of said first peak holding means to remove a direct-current component from said detected signal.

3. An equalizer comprising:
   a filter means for extracting a high-frequency component from an input signal to provide a first signal;
   a first amplifying means for amplifying, based on an amplification factor control signal, said first signal to generate a second signal;
   a second amplifying means for amplifying said input signal to generate a third signal;
   a superimposing means for superimposing said second signal and said third signal on each other to generate a fourth signal; and
   an amplitude detecting means for detecting an amplitude of said fourth signal to generate, based on the detected amplitude, said amplification factor control signal;
   said amplitude detecting means having
      a first peak holding means for generating a first peak voltage signal for holding a peak voltage of said fourth signal,
      a first differential signal generating means for generating a first differential signal between said first peak voltage signal and said fourth signal,
      a second peak holding means for generating a first amplitude detect signal holding a peak voltage of said first differential signal,
      a third peak holding means for generating a third peak voltage signal for holding a peak voltage of a reference signal,
      a second differential signal generating means for generating a second differential signal between said third peak voltage signal and said reference signal,
      a fourth peak holding means for generating a second amplitude detect signal holding a peak voltage of said second differential signal, and
      a third differential signal generating means for generating said amplification factor control signal corresponding to a difference between said first amplitude detect signal and said second amplitude detect signal.

4. The equalizer as set forth in claim 3, further comprising a capacitor that is arranged in a preceding stage of said first peak holding means to remove a direct-current component from said fourth signal.

5. The equalizer as set forth in claim 3, said input signal is a video signal of a R (Red), a G (Green) and a B (Blue).

* * * * *